(12) United States Patent
Ouyang et al.

(10) Patent No.: US 7,859,987 B2
(45) Date of Patent: Dec. 28, 2010

(54) INTERLEAVER FOR IEEE 802.11N STANDARD

(75) Inventors: Xuemei Ouyang, San Jose, CA (US); Chiu Ngo, San Francisco, CA (US)

(73) Assignee: Samsung Electronic Co., Ltd., Suwon (KR)

( * ) Notice: Subject to any disclaimer, the term of this patent is extended or adjusted under 35 U.S.C. 154(b) by 1405 days.

(21) Appl. No.: 11/313,403

(22) Filed: Dec. 20, 2005

(65) Prior Publication Data

US 2007/0140364 A1 Jun. 21, 2007

(51) Int. Cl.
*H40L 11/00* (2006.01)
(52) U.S. Cl. .................................. 370/208; 375/260
(58) Field of Classification Search ......... 370/203–210; 375/260–265
See application file for complete search history.

(56) References Cited

U.S. PATENT DOCUMENTS

| | | | |
|---|---|---|---|
| 4,394,642 | A | 7/1983 | Currie et al. |
| 5,745,528 | A | 4/1998 | Fimoff et al. |
| 5,987,070 | A | 11/1999 | Fimoff et al. |
| 6,775,335 | B2 | 8/2004 | Sommer et al. |
| 6,901,550 | B2 | 5/2005 | Adar et al. |
| 6,961,388 | B2 | 11/2005 | Ling et al. |
| 7,010,053 | B2 | 3/2006 | El-Gamal et al. |
| 7,127,658 | B2 | 10/2006 | Cucchi et al. |
| 7,154,936 | B2 | 12/2006 | Bjerke et al. |
| 7,284,185 | B2 | 10/2007 | Chen |
| 7,366,249 | B2 | 4/2008 | Gresset et al. |
| 7,397,862 | B2 | 7/2008 | Ouyang et al. |
| 7,480,739 | B1 * | 1/2009 | Berendsen ...................... 710/5 |
| 7,523,377 | B2 | 4/2009 | Halter |
| 7,542,410 | B2 | 6/2009 | Berkovich |
| 7,570,645 | B2 | 8/2009 | Agarwal |
| 7,570,697 | B2 | 8/2009 | Van Nee |
| 7,593,472 | B2 | 9/2009 | Chen et al. |
| 2003/0074625 | A1 | 4/2003 | Adar et al. |
| 2004/0047424 | A1 | 3/2004 | Ramaswamy et al. |
| 2005/0256821 | A1 | 11/2005 | Mishra et al. ................... 707/1 |
| 2005/0265469 | A1 | 12/2005 | Aldana et al. |
| 2005/0283705 | A1 | 12/2005 | McNamara |
| 2006/0013330 | A1 | 1/2006 | Ha |
| 2006/0036924 | A1 | 2/2006 | Ghosh ....................... 714/755 |
| 2006/0088115 | A1 | 4/2006 | Chen et al. |

(Continued)

OTHER PUBLICATIONS

U.S. Non-Final Office Action for U.S. Appl. No. 11/292,851 mailed on Aug. 20, 2009.

(Continued)

*Primary Examiner*—Ricky Ngo
*Assistant Examiner*—Kan Yuen
(74) *Attorney, Agent, or Firm*—Kenneth L. Sherman, Esq.; Michael Zarrabian, Esq.; Myers Andras Sherman & Zarrabian LLP

(57) ABSTRACT

A MIMO wireless system includes a transmitter having a parser that parses a bit stream into multiple spatial data streams and multiple interleavers corresponding to the multiple spatial data streams, where each interleaver interleaves the bits in the corresponding spatial data stream by performing frequency rotation after an interleaving operation, to increase diversity of the wireless system. The MIMO wireless system also includes a receiver that has deinterleavers that deinterleaves spatial bit streams transmitted by the transmitter.

23 Claims, 8 Drawing Sheets

U.S. PATENT DOCUMENTS

| | | | |
|---|---|---|---|
| 2006/0093059 | A1 | 5/2006 | Skraparlis |
| 2006/0107171 | A1 | 5/2006 | Skraparlis |
| 2006/0120469 | A1 | 6/2006 | Maltsev et al. |
| 2006/0187815 | A1* | 8/2006 | Wallace et al. ............... 370/203 |
| 2006/0227892 | A1 | 10/2006 | Ouyang et al. |
| 2006/0274687 | A1 | 12/2006 | Kim |
| 2007/0067696 | A1 | 3/2007 | Bhatt et al. |
| 2007/0110178 | A1* | 5/2007 | Su et al. .................... 375/260 |
| 2007/0127587 | A1 | 6/2007 | Ouyang et al. |
| 2007/0140100 | A1 | 6/2007 | Ouyang et al. |
| 2007/0140103 | A1 | 6/2007 | Ouyang et al. |
| 2007/0140364 | A1 | 6/2007 | Ouyang et al. |
| 2007/0147521 | A1 | 6/2007 | Horng et al. |

OTHER PUBLICATIONS

U.S. Notice of Allowance for U.S. Appl. No. 11/292,851 mailed on Feb. 1, 2010.

U.S. Notice of Allowance for U.S. Appl. No. 11/317,409 mailed on Mar. 1, 2010.

U.S. Non-Final Office Action for U.S. Appl. No. 11/317,409 mailed on Aug. 11, 2009.

U.S. Notice of Allowance for U.S. Appl. No. 11/104,808 mailed on Jul. 6, 2009.

U.S. Advisory Action for U.S. Appl. No. 11/104,808 mailed on Apr. 6, 2009.

S.A. Mujtaba, "TGn Sync Proposal Technical Specification," IEEE 802.11 11-04-889r1, Nov. 2004, p. 1-143.

Manoneet Singh et al. and Bruce Edwards et al., "WWiSE proprosal: High Throughput Extension to the 802.11 Standard," a contribution to IEEE 802.11 11-04-088r4, Nov. 2004, pp. 1-80.

U.S. Appl. No. 11/104,808, filed Apr. 12, 2005, X. Ouyang et al.

Aziz, M.K. et al., "A Study of Performance and Complexity for IEEE 802.11n MIMO-OFDM GIS Solutions," Communications, 2004 IEEE International Conference on. New York: IEEE, 2004, pp. 3822-3826, vol. 7.

Mujtaba, S., "TGn Sync Proposal Technical Specification," a contribution to IEEE 802.11-0410889r2, Jan. 2005, pp. 1-152.

International Search Report for International Application No. PCT/KR2006/005555 from Korean Intellectual Property Office dated Mar. 20, 2007, 3 pages.

Written Opinion of the International Searching Authority for International Application No. PCT/KR2006/005555 from Korean Intellectual Property Office dated Mar. 20, 2007, 4 pgs.

Kose, C., Edwards, B., "WWiSE Proposal: High throughput extension to the 802.11 Standard," IEEE 802.11-05/0149r2, Mar. 2005, pp. 1-93.

Mujtaba, S., "TGn Sync Proposal Technical Specification," IEEE 802.11-04/0889r7, Jul. 2005, pp. 1-133.

Naguib, A.F. et al., "Increasing Data Rate Over Wireless Channels," Signal Processing Magazine, IEEE, May 2000, pp. 76-92, vol. 17 Iss. 3, IEEE, Florham Park, NJ, USA.

International Search Report for International Application No. PCT/KR2006/005133 from Korean Intellectual Property Office dated Feb. 26, 2007, 3 pages.

Written Opinion of the International Searching Authority for International Application No. PCT/KR2006/005133 frpm Korean Intellectual Property Office dated Feb. 26, 2007, 3 pages.

Mujtaba, S., "TGn Sync Proposal Technical Specification," IEEE 802.11-04/0889r44, Mar. 4, 2005, pp. 1-162.

Mujtaba, S., "TGn Sync Proposal Technical Specification," Aug. 13, 2004, IEEE 802.11-04/889r0, pp. 1-135.

U.S. Office Action for U.S. Appl. No. 11/292,851 on Mar. 31, 2009.

U.S. Office Action for U.S. Appl. No. 11/292,851 mailed on Oct. 16, 2008.

U.S. Office Action for U.S. Appl. No. 11/314,929 mailed on Apr. 3, 2009.

U.S. Notice of Allowance for U.S. Appl. No. 11/253,855 mailed on Mar. 4, 2008.

U.S. Office Action for U.S. Appl. No. 11/314,925 mailed on Apr. 13, 2009.

U.S. Office Action for U.S. Appl. No. 11/314,929 mailed on Oct. 10, 2008.

U.S. Office Action for U.S. Appl. No. 11/314,925 mailed on Oct. 15, 2008.

U.S. Office Action for U.S. Appl. No. 11/317,409 mailed on May 1, 2009.

U.S. Office Action for U.S. Appl. No. 11/317,409 mailed on Nov. 13, 2008.

U.S. Non-Final Office Action for U.S. Appl. No. 11/104,808 mailEd on Jan. 24, 2008.

U.S. Non-Final Office Action for U.S. Appl. No. 11/104,808 mailed on Jul. 21, 2008.

U.S. Final Office Action for U.S. Appl. No. 11/104,808 mailed on Jan. 6, 2009.

U.S. Notice of Application U.S. Appl. No. 11/253,855 mailed on Mar. 4, 2008.

U.S. Non-Final office Action for U.S. Appl. No. 11/104,808 mailed on Jan. 24, 2008.

U.S. Final office Action for U.S. Appl. No. 11/104,808 mailed on Apr. 6, 2009.

* cited by examiner

INTERLEAVER FOR IEEE 802.11N STANDARD

FIELD OF THE INVENTION

The present invention relates generally to data communication, and more particularly, to data communication with transmission diversity using Orthogonal Frequency Division Multiplexing (OFDM) in multiple antenna channels.

BACKGROUND OF THE INVENTION

In wireless communication systems, antenna diversity plays an important role in increasing the system link robustness. OFDM is used as a multiplexing technique for transmitting digital data using radio frequency signals (RF). In OFDM, a radio signal is divided into multiple sub-signals that are transmitted simultaneously at different frequencies to a receiver. Each sub-signal travels within its own unique frequency range (sub-channel), which is modulated by the data. OFDM distributes the data over multiple channels, spaced apart at different frequencies.

OFDM modulation is typically performed using a transform such as Fast Fourier Transform (FFT) process wherein bits of data are encoded in the frequency-domain onto sub-channels. As such, in the transmitter, an Inverse FFT (IFFT) is performed on the set of frequency channels to generate a time-domain OFDM symbol for transmission over a communication channel. The IFFT process converts the frequency-domain data for each sub-channel into a block of time-domain samples which are later on converted to an analogue modulating signal for an RF modulator. In the receiver, the OFDM signals are processed by performing an FFT process on each symbol to convert the time-domain data into frequency-domain data, and the data is then decoded by examining the phase and amplitude of the sub-channels. Therefore, at the receiver the reverse process of the transmitter is implemented. Further, transmission antenna diversity schemes are used to improve the OFDM system reliability. Such transmit diversity schemes in OFDM systems are encoded in the frequency-domain as described.

OFDM has been selected as the basis for the high speed wireless local area network (WLAN) standards by the IEEE 802.11a standardization group, and is also being considered as the basis for the high throughput WLAN 802.11n. A typical transmitter for a conventional OFDM MIMO system implementing WLAN 802.11n comprises a channel encoder, a puncturer, a spatial parser, and multiple data stream processing paths. Each data stream processing path comprises an interleaver, a constellation mapper, an IFFT function, and guard interval insertion window and an RF modulator.

For parser and interleaver portion of the system, coded and punctured bits are interleaved across spatial streams and frequency tones. There are two steps to the space-frequency interleaving: spatial stream parsing and frequency interleaving. First, encoded and punctured bits are parsed to multiple spatial streams by a round-robin parser. The parser sends consecutive blocks of bits to different spatial streams in a round-robin fashion starting with the first spatial stream. Second, all encoded bits are interleaved by a separate block interleaver for each spatial stream, with a block size corresponding to the number of bits in a single OFDM symbol. The block interleavers are based on the 802.11a interleaver, with certain modifications to allow for multiple spatial streams and 40 MHz transmissions.

The interleaver is defined by a two-step permutation. The first permutation ensures that adjacent coded bits are mapped onto nonadjacent subcarriers. The second permutation ensures that coded bits are mapped alternately onto less and more significant bits of the constellation and thereby long runs of low reliability (LSB) bits are avoided. A deinterleaver in a receiver performs the inverse operation, and is also defined by two permutations corresponding to the two interleaver permutations.

Such conventional system provides write in block, one column rotation for multiple antennas transmission, and PAM order rotation within a column as described in S. A. Mujtaba, "TGn Sync Proposal Technical Specification," a contribution to IEEE 802.11 11-04-889r1, November 2004 and Manoneet Singh et al. and Bruce Edwards et al., "WWiSE proposal: High throughput extension to the 802.11 Standard," a contribution to IEEE 802.11 11-04-0886r4, November 2004, (incorporated herein by reference). However, because the columns are rotated by only one column, adjacent bits only 3 and 6 sub-carriers apart for 20 MHz and 40 MHz systems, respectively. As a result, in a correlated channel, the diversity gain is not fully utilized.

Another conventional transmitter design includes a channel encoder, a puncturer, a frequency interleaver, a spatial parser, and two data stream processing paths. Each data stream processing path comprises a constellation mapper, an IFFT function, guard interval insertion window and an RF modulator. The interleaver performs interleaving on two consecutive OFDM symbols before they are parsed onto two different antennas. The relation for the first permutation is:

$$i = N_{row} \times (k \bmod N_{column}) + \mathrm{floor}(k/N_{column})$$

where $N_{column} = 32$, $N_{row} = 2N_{CBPS}/N_{column}$

After the interleaving, the spatial parser parses the interleaved bits in group by a round robin fashion to different spatial streams. The group size equals to the number of bits in one QAM symbol. For example, for 64 QAM, 6 bits will be parsed onto one spatial stream and the next 6 bits will be parsed onto another spatial stream. However, such a transmitter is not flexible enough to accommodate different channel coding and modulation schemes on different special streams.

BRIEF SUMMARY OF THE INVENTION

In one embodiment, the present invention provides an interleaver design for a transmitter that is flexible enough to accommodate different channel coding and modulation schemes on different special streams.

Accordingly, an MIMO wireless system according to an embodiment of the present invention includes a transmitter having a parser that parses a bit stream into multiple spatial data streams and multiple interleavers corresponding to the multiple spatial data streams, where each interleaver interleaves the bits in the corresponding spatial data stream by performing a frequency rotation, which is equivalent to multiple column rotations and at least one row rotation, to increase diversity of the wireless system. The MIMO wireless system also includes a receiver that has deinterleavers that deinterleavers spatial bit streams transmitted by the transmitter.

These and other features, aspects and advantages of the present invention will become understood with reference to the following description, appended claims and accompanying figures.

DETAILED DESCRIPTION OF THE INVENTION

In one embodiment, the present invention provides a method of bit stream interleaving for a MIMO system. The interleaving method uses frequency rotation to better explore the diversity of the wireless system and simplify the implementation.

Figure 1A:
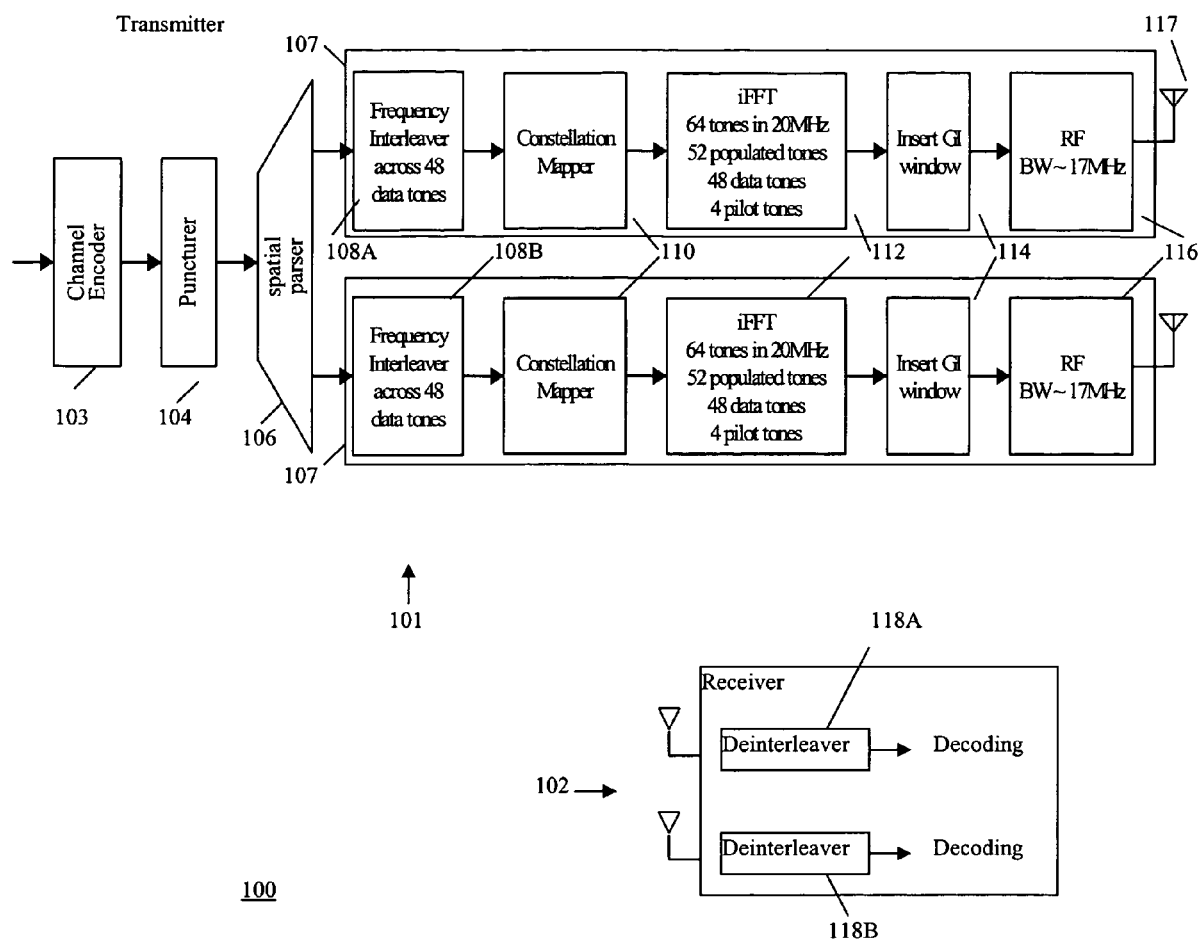
FIG. 1A shows a functional block diagram of an embodiment of an OFDM MIMO transmitter having a transmitter data path for 2-antenna MIMO in a 20 MHz channel, according to the present invention.

FIG. 1A shows an example block diagram of an OFDM MIMO system 100 (e.g., 20 MHz channel) implementing WLAN 802.11n, according to an embodiment of the present invention. The system 100 includes a transmitter 101 and a receiver 102. The transmitter 101 comprises a channel encoder 103, a puncturer 104, a spatial parser 106, and two data stream processing paths 107. Each data stream processing path 107 comprises an interleaver (e.g., interleaver 108A for a first processing path, and interleaver 108B for a second processing path), a constellation mapper 110, an IFFT function 112, and guard interval insertion window 114 and an RF modulator 116. For the parser 106 and the interleavers 108A, 108B portions of the transmitter, coded and punctured bits are interleaved across spatial streams and frequency tones. There are two steps to the space-frequency interleaving: spatial stream parsing and frequency interleaving.

Conventionally, encoded and punctured bits are parsed to multiple spatial streams by a round-robin parser where $$s=\max\{N_{BPSC}/2,1\} \quad (1)$$

such that s is the number of bit parsed onto one antenna each round, and $N_{BPSC}$ is the number of coded bits per subcarrier. A conventional parser sends consecutive blocks of s bits to different spatial streams in a round-robin fashion starting with the first spatial stream. All encoded bits are conventionally interleaved by a separate block interleaver for each spatial stream, with a block size corresponding to the number of coded bits in a single OFDM symbol, $N_{CBPS}$. The conventional block interleavers are based on the 802.11a interleaver, with certain modifications to allow for multiple spatial streams and 40 MHz transmissions.

The basic interleaver array has $N_{row}$ rows and $N_{column}$ columns and $N_{BPSC}$ is the number of coded bits per subcarrier (e.g. $N_{BPSC}=1$ for BPSK, 2 for QPSK, 4 for 16 QAM, etc), wherein the interleaver parameters are shown in Table 1 below.

TABLE 1

Interleaver Parameters

| | $N_{column}$ | $N_{row}$ |
|---|---|---|
| 20 MHz channels | 16 | 3 $N_{BPSC}$ |
| 40 MHz channels | 18 | 6 $N_{BPSC}$ |

A conventional interleaver is defined by a two-step permutation. The first-step permutation (first permutation) ensures that adjacent coded bits are mapped onto nonadjacent subcarriers. The first permutation is modified from the 802.11a interleaver such that the column indexes in the array are rotated by one column for each spatial stream. The second-step permutation (second permutation) ensures that coded bits are mapped alternately onto less and more significant bits of the constellation and thereby long runs of low reliability (LSB) bits are avoided.

Relations (2) and (3) below define a conventional interleaver, wherein the index of the coded bit before the first permutation is denoted by k, and i is the index after the first and before the second permutation. In the conventional interleaver, the first permutation is defined by relation (2) below:

$$i=N_{row}\times(((k \bmod N_{column})+i_{SS}) \bmod N_{column})+\text{floor}(k/N_{column}), \quad (2)$$

$$k=0,1,\ldots,N_{CBPS}-1,$$

where $i_{SS}=0,1,\ldots,N_{SS}-1$, is the index of the spatial stream on which this interleaver is operating. The insertion of $i_{SS}$ is a modification of the 802.11a interleaver. This results in a "column offset" in the de-interleaving process. That is, bits are read in by rows and out by columns, but starting with column $i_{SS}$ in a column-cyclic fashion.

Further, conventionally the second permutation is defined by relation (3) below, wherein j is the index after the second permutation, just prior to modulation mapping:

$$j=s\times\text{floor}(i/s)+(i+N_{CBPS}-\text{floor}(N_{column}\times i/N_{CBPS})) \bmod s, \quad (3)$$

$$i=0,1,\ldots,N_{CBPS}-1,$$

where s is determined according to relation (4) below:

$$s=\max(N_{BPSC}/2,1). \quad (4)$$

Similarly, a deinterleaver in a receiver performs the inverse relation, and is defined by a first-step permutation and a second-step permutation corresponding to the conventional interleaver permutations above. Relations (5) and (6) define these first and second permutations for a conventional deinterleaver, wherein the index of the original received bit before the first permutation is denoted by j, and i is the index after the first and before the second permutation.

Conventionally, the first permutation in the deinterleaver is defined by relation (5) below:

$$i=s\times\text{floor}(j/s)+(j+\text{floor}(N_{column}\times j/N_{CBPS})) \bmod s, \quad (5)$$

$$j=0,1,\ldots,N_{CBPS}-1,$$

where s is as defined in relation (4) above. The first permutation in relation (5) is the inverse of the permutation in relation (3) above.

Conventionally, the second permutation in the deinterleaver is defined by relation (6) below, where k is the index after the second permutation:

$$k = N_{column}(i \bmod N_{row}) + (\text{floor}(i/N_{row}) - i_{ss} + N_{column}) \bmod N_{column}, \quad (6)$$

$i = 0, 1, \ldots, N_{CBPS} - 1$.

The second permutation in relation (6) is the inverse of the interleaver permutation in relation (2) above.

As noted, the conventional system provides write in block, column rotation for multiple antennas transmission, and PAM order rotation within a column. However, because the columns are rotated by only one column, adjacent bits only e.g. 3 and 6 sub-carriers apart for 20 MHz and 40 MHz systems. As a result, in a correlated channel, the diversity gain is not fully utilized.

In the commonly assigned patent application Ser. No. 11/104,808, filed on Apr. 12, 2005, an improved interleaving process is described which increases the column rotation to the largest possible distance within a block to fully explore the diversity of the wireless system. In such improved interleaving process, in a first permutation, the column rotation is changed from one column rotation to $((N_{column}/N_{ss}) \times i_{ss})$ column rotations, where $N_{ss}$ is the total number of spatial data streams and $i_{ss}$ is index of spatial data stream which ranges from e.g. 0 to $N_{ss}-1$. As such, in contrast to the conventional interleaving relation (2) above, the first permutation in the improved interleaving process is defined by relation (7) below:

$$i = N_{row} \times (((k \bmod N_{column}) + \text{floor}(N_{column}/N_{ss}) \times i_{ss}) \bmod N_{column}) + \text{floor}(k/N_{column}) \quad (7)$$

where $k = 0, 1, \ldots, N_{CBPS} - 1$.

On the receiver side, a deinterleaving process performs the reverse operation for de-interleaving the received bits. In contrast to the conventional deinterleaving relation (6) above, the second permutation in the deinterleaver is defined by relation (8) below:

$$k = N_{column} \times (i \bmod N_{row}) + (\text{floor}(i/N_{row}) - \text{floor}(N_{column}/N_{ss}) \times i_{ss} + N_{column}) \bmod N_{column} \quad (8)$$

wherein $i = 0, 1, \ldots, N_{CBPS} - 1$.

For example, if two data streams are to be transmitted, using the improved interleaving process. The adjacent data bits are separated 8 columns apart for different data streams in a 20 MHz channel. In another example, the adjacent data bits are separated 9 columns apart for different data streams in a 40 MHz channel.

In one example transmitter where there are multiple spatial streams, a block of bits in first data stream is transmitted without any rotation in that block. Conventionally, each remaining spatial stream is transmitted after $i_{ss}$ column rotation relative to the first spatial stream. However using the improved interleaving process, each remaining spatial stream is transmitted after multiple column rotations, wherein the number of rotations is the number of columns in the interleaver array divided by the number of spatial streams.

In another example transmitter where there are two spatial streams, and one spatial stream is transmitted over a first antenna, and the other over a second antenna, a first block of bits is transmitted over the first antenna without any rotation in that block. Conventionally, for the second antenna, data is transmitted with one column rotation where the second column is rotated to the first column, and so one, so that all the columns are shifted/rotated left by one column. Using the improved, however, for the second antenna, the number of rotations is the number of columns in the interleaver array divided by the number of antennas. For example, for a 20 MHz transmitter having two antennas, the interleaver array comprises 16 columns and three rows of bits. Using the improved interleavers, for the second antenna the number of rotations is the number of columns (16) divided by the number of antennas (2), resulting in 8 column rotations. As such, columns 9 through 16 are shifted into the first part (first 8 columns) of the array block, and columns 1 through 8 are shifted into the second part (second 8 columns) of the array block for transmission.

The MIMO system performance (e.g., packet error rate vs. signal to noise ratio) using multiple column rotation interleaving in the improved interleavers is improved in comparison to a conventional system with one column rotation interleaving. This is because in OFDM different subcarriers are used and when bits are rotated by multiple columns, adjacent bits are separated further in the spatial domain and in the subcarrier space, reducing fading in transmission channels.

Using multiple column rotation according to the improved interleaving process, two adjacent bits have less probability of seeing the same channel. As such, in the receiver when the received data bits are de-interleaved for convolution decoding, if one received bit has low energy (bad bit) because of transmission in a fading channel, and an adjacent bit has high energy (good bit), the good bit can be used to recover the bad bit by convolution decoding.

With the conventional one column rotation interleaving, the adjacent data bits are spatially close and can face the same bad transmission channel. In a case where there are several continuous bits that face the same bad channel, it is difficult for the receiver to recover the bits by convolution decoding. However, with multiple column rotation in the improved interleaving process, adjacent bits are spatially separated such that they are less likely to be transmitted in the same bad/fading channel. As such, if a bit is transmitted in a bad channel, and the adjacent bits are transmitted via good channels, decoding in the receiver can still recover the bit transmitted via the bad channel using the bits transmitted in the good channels.

In the commonly assigned patent application Ser. No. 11/292,851 entitled: "An improved interleaver design for IEEE 802.11n standard", (incorporated herein by reference), to further separate adjacent bits into different sub-band and different spatial stream, in addition to larger column rotation an additional row rotation is performed on different spatial streams, which result in the change of relation (2) above to relation (10) below:

$$i = N_{row} * (((k \bmod N_{column}) + \text{floor}(N_{column}/N_{ss}) * i_{ss}) \bmod N_{column}) + (\text{floor}(k/N_{column}) + \text{ceil}(N/N_{ss} * i_{ss}) * N_{BPSC}) \bmod N_{row} \quad (10)$$

where $k = 0, 1, \ldots N_{CBPS} - 1$, and
$i_{ss} = 0 \ldots N_{ss} - 1$ where $N_{ss}$ is the number of spatial data streams.

Accordingly, the corresponding deinterleaving relation is modified into relation (11) below, as:

$$k = (N_{column} * (i \bmod N_{row}) + (\text{floor}(i/N_{row} - \text{floor}(N_{column}/N_{ss}) * i_{ss})) \bmod N_{col} + N_{column} * (N - \text{ceil}(N/N_{ss} * i_{ss})) * N_{BPSC}) \bmod N_{CBPS}, \quad (11)$$

wherein $i = 0, 1, \ldots N_{CBPS} - 1$
$i_{ss} = 0 \ldots N_{ss} - 1$, where $N_{ss}$ is the number of spatial data streams.

Improved Interleaver/Deinterleaver

According to the present invention, an embodiment of a further improved interleaving process is implemented in the system 100 of FIG. 1A, to further separate adjacent bits into different sub-band and different spatial stream, wherein in addition to larger column rotations (e.g., Ncol/Nss), one or more additional row rotations on different spatial streams with unification of row and column rotation by a frequency rotation, are performed. Row cyclic rotation is the same operation as in column cyclic rotation except the operation is on the rows instead of columns.

Instead of viewing the problem in the interleaver block (array), the implementation of the column and row interleaving according to an embodiment of the present invention includes two steps: First, performing the same interleaving for all the data streams using IEEE802.11a interleaver parameters. The output data bits are then mapped to different sub-carriers of an OFDM symbol. Second, different cyclic shift are performed along the frequency sub-carriers for different data streams to obtain the same effect of column and row rotation in the first permutation of the interleaver operation.

In one example of the further improved interleaving process according to an embodiment of the present invention, such is accomplished by relations (12) through (14) below for the interleavers 108A, 108B.

The further improved interleaving process for the interleavers 108A, 108B, is implemented in three steps according to relations (12) through (14):

$$i = N_{row} \times (k \bmod N_{column}) + \text{floor}(k/N_{column}), k=0, 1, \ldots, N_{CBPS}-1, \quad (12)$$

$$j = s \times \text{floor}(i/s) + (i + N_{CBPS} - \text{floor}(N_{column} \times i/N_{CBPS})) \bmod s, i=0, 1, \ldots, N_{CBPS}-1, \quad (13)$$

where s is determined according to $s = \max(N_{BPSC}/2, 1)$, $$r = (j - ((2 \times i_{ss}) \bmod 3 + 3 \times \text{floor}(i_{ss}/3)) \times N_{rot} \times N_{BPSC}) \bmod N_{CBPS}, j=0, 1, \ldots, N_{CBPS}-1, \quad (14)$$

wherein in relations (12) to (14), the index of the coded bit before the first permutation is denoted by k, and i is the index after the first and before the second permutation, and j is the index after the second permutation and before the third permutation, and r is the index after the third permutation, $i_{ss}=0, 1, \ldots, N_{SS}-1$ is the index of the spatial stream on which this interleaver is operating and $N_{rot}$ is a base rotation number in use. We choose $N_{rot}$ equal to 11 and 29 for 20 MHz and 40 MHz operation respectively. The $i_{ss}$ parameter controls the rotation of each stream such that for the first stream, there will be no frequency rotation Relation (12) above ensures that adjacent coded bits are mapped onto nonadjacent sub-carriers. Relation (13) above ensures that coded bits are mapped alternately onto less and more significant bits of the constellation whereby long runs of low reliability (LSB) bits are avoided. Relation (14) represents the frequency rotation operation.

Accordingly, the corresponding deinterleaving relations for the deinterleavers 118A, 118B in the example receiver 102, are according to relations (15) to (17) below:

$$x_d = (x_{dd} + ((2 \times i_{ss}) \bmod 3 + 3 \times \text{floor}(i_{ss}/3)) \times N_{rot} \times N_{BPSC}) \bmod N_{CBPS}$$

$$x_{dd} = 0, 1, \ldots, N_{CBPS}-1, \quad (15)$$

$$j_d = s \times \text{floor}(j_{dd}/s) + (j + \text{floor}(N_{column} \times j_{dd}/N_{CBPS})) \bmod s$$

$$j_{dd} = 0, 1, \ldots, N_{CBPS}-1, \quad (16)$$

$$i_d = N_{column} \times i_{dd} - (N_{CBPS}-1) \times \text{floor}(N_{column} \times i_{dd}/N_{CBPS}),$$

$$i_{dd} = 0, 1, \ldots, N_{CBPS}-1, \quad (17)$$

wherein $i_{dd}$, $j_{dd}$ represent the index before operation of each step accordingly, the index of the coded bit before the first permutation is denoted by $x_{dd}$, before the second permutation and after the first permutation by $j_{dd}$ and before third permutation and after second permutation by $i_{dd}$, and $x_d$ is the index after the first and before the second permutation, and $j_d$ is the index after the second permutation and before the third permutation, and $i_d$ is the index after the third permutation.

Relations (15) through (17) above perform inverse steps of relations (14) through (12), respectively.

For example, in a 20 MHz channelization case, the block size of the interleaver is $3 \ast N_{BPSC}$ rows and 16 columns. For a two data stream case, the interleaver for the first data stream can be the same as an IEEE802.11a interleaver. However, for the second data stream, in addition to the usual 802.11a interleaver operation, according to an embodiment of the present invention an additional step of frequency rotation is added before the IFFT operation.

A simple example of BPSK case where $N_{BPSC}=1$ is now described. The following example Tables 2(a)-(c) show the bit positions for a BPSK modulated OFDM symbol before and after the interleaving operation.

TABLE 2(a)

| | | | | bit position in the interleaver block | | | | | | | | | | | |
|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | 16 |
| 17 | 18 | 19 | 20 | 21 | 22 | 23 | 24 | 25 | 26 | 27 | 28 | 29 | 30 | 31 | 32 |
| 33 | 34 | 35 | 36 | 37 | 38 | 39 | 40 | 41 | 42 | 43 | 44 | 45 | 46 | 47 | 48 |

The bits are written in rows and read out in columns, such that after the block interleaving, the bit positions on the sub-carriers are shown in Table 2(b) below:

TABLE 2(b)

| 1 | 17 | 33 | 2 | 18 | 34 | 3 | 19 | 35 | 4 | 20 | 36 | 5 | 21 | 37 | 6 | 22 | 38 | 7 | 23 | 39 | 8 |
|---|---|---|---|---|---|---|---|---|---|---|---|---|---|---|---|---|---|---|---|---|---|
| 24 | 40 | 9 | 25 | 41 | 10 | 26 | 42 | 11 | 27 | 43 | 12 | 28 | 44 | 13 | 29 | 45 | 14 | 30 | 46 | | |
| 15 | 31 | 47 | 16 | 32 | 48 | | | | | | | | | | | | | | | | |

The bit positions after the frequency rotation is shown in Table 2(c) below:

TABLE 2(c)

| 9 | 25 | 41 | 10 | 26 | 42 | 11 | 27 | 43 | 12 | 28 | 44 | 13 | 29 | 45 | 14 | 30 | 46 | 15 | 31 |
|---|----|----|----|----|----|----|----|----|----|----|----|----|----|----|----|----|----|----|----|
| 47 | 16 | 32 | 48 | 1 | 17 | 33 | 2 | 18 | 34 | 3 | 19 | 35 | 4 | 20 | 36 | 5 | 21 | 37 | 6 | 22 | 38 |
| 7 | 23 | 39 | 8 | 24 | 40 | | | | | | | | | | | | | | |

Figure 1B:
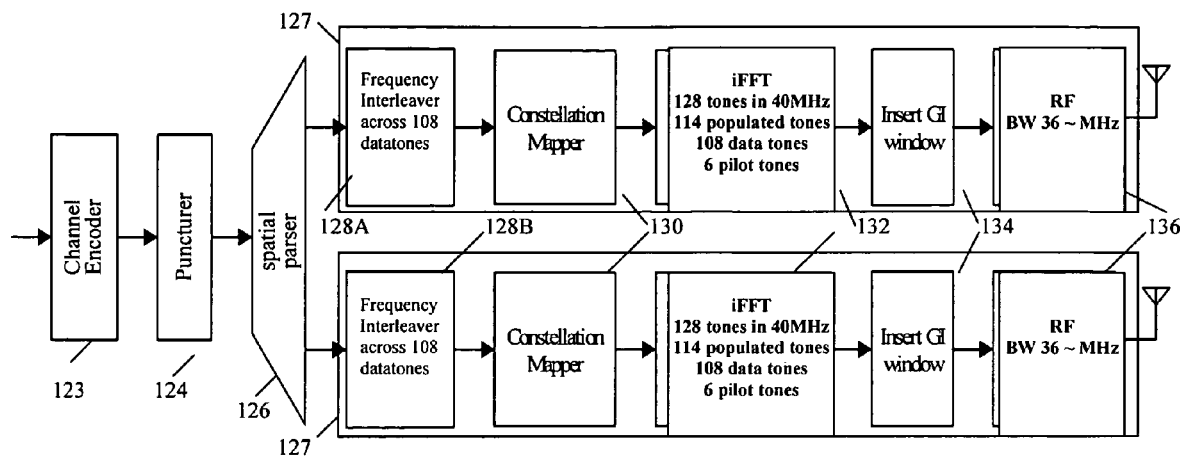
FIG. 1B shows a functional block diagram of an embodiment of an OFDM MIMO transmitter having a transmitter data path for 2-antenna MIMO in a 40 MHz channel, according to the present invention.

FIG. 1B shows a functional block diagram of an embodiment of an OFDM MIMO transmitter 120 having a transmitter data path for 2-antenna MIMO in a 40 MHz channel, according to the present invention. The transmitter 120 comprises a channel encoder 123, a puncturer 124, a spatial parser 126, and two data stream processing paths 127. Each data stream processing path 127 comprises an interleaver (e.g., interleaver 128A for a first processing path, and interleaver 128B for a second processing path), a constellation mapper 130, an IFFT function 132, and guard interval insertion window 134 and an RF modulator 136. For the parser 126 and the interleavers 128A, 128B portions of the transmitter, coded and punctured bits are interleaved across spatial streams and frequency tones. The interleavers 128A and 128B implement an embodiment of said further improved interleaving process according to the present invention as described herein.

Figure 2:
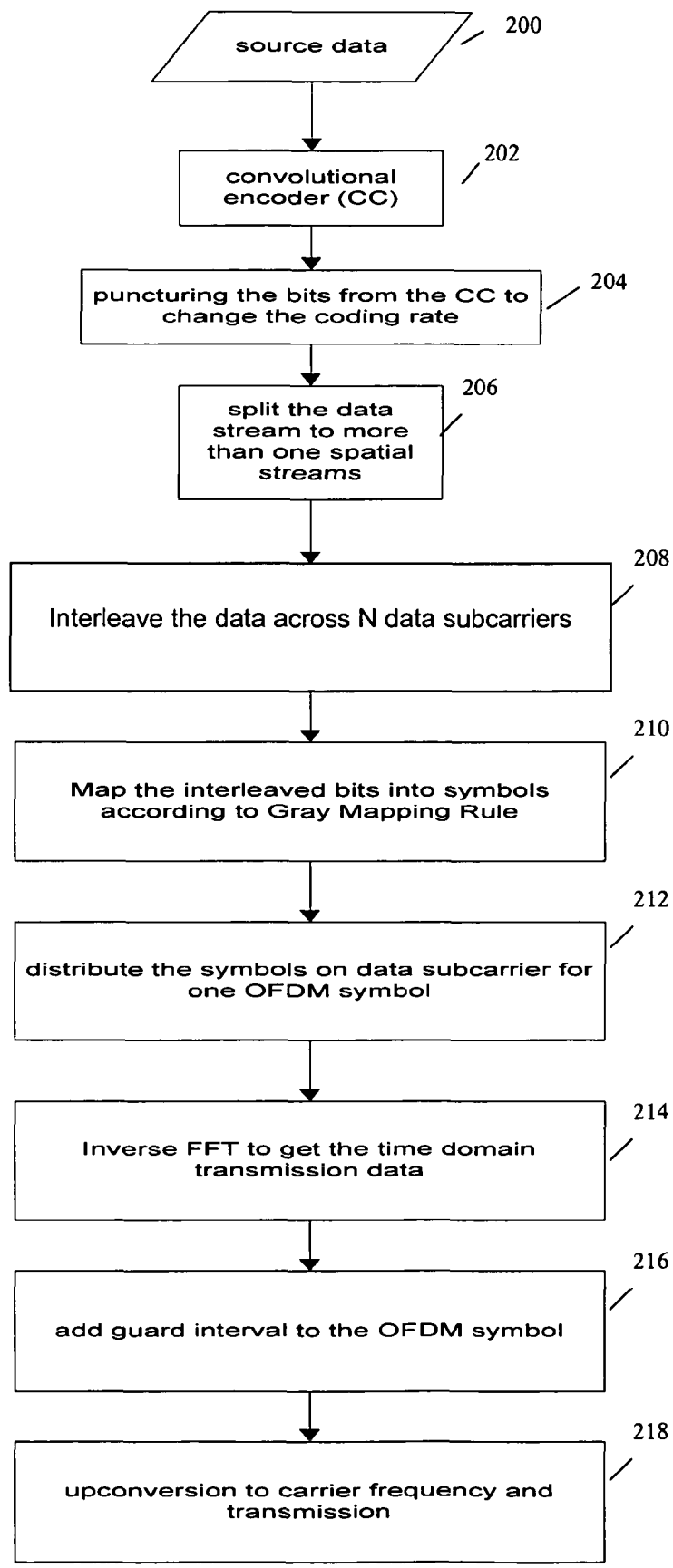
FIG. 2 shows a flowchart of the steps of an embodiment of an interleaving process in a MIMO transmitter according to the present invention.

FIG. 2 shows a flowchart of the steps of example operation of the transmitter 101 of FIG. 1A (or transmitter of FIG. 1B) according to an embodiment of said further improved interleaving process provided by the present invention. According to the example in FIG. 2, the transmitter 101 of FIG. 1A operates according to the steps of: source bit stream is received (step 200); the channel encoder 103 encodes data using convolutional encoding (CC) (step 202); the puncturer 104 punctures the bits from the CC to change the coding rate (step 204); the spatial parser 106 separates the data stream into several spatial streams (step 206); then in each processing path 107 beyond the first path, an interleaver 108B interleaves the bits using identical 802.11a alike interleaver plus an additional different frequency rotations according to an embodiment of the present invention (i.e., for different spatial streams different rotations are used e.g. interleave the data across 48 data subcarriers for 20 MHz channel, interleave the data across 108 data subcarriers for 40 MHz channel, etc.) (step 208); the constellation mapper 110 groups/maps the interleaved bits into symbols using a Gray Mapping Rule (e.g., BPSK groups 1 bit into one symbol; 64 QAM groups 6 bits into one symbol, etc.) (step 210); the symbols are distributed on data subcarrier of one OFDM symbol by an IFFT operation wherein the data symbols are mapped onto each subcarrier for IFFT (step 212); the IFFT function 112 converts the frequency domain data to time domain transmission data (step 214); the guard window 114 adds guard interval to each OFDM symbol in time domain, to prevent inter symbol interference (step 216); and in the RF modulator 116 the signal is RF modulated and transmitted through the channel via antennas 117 (step 218).

Figure 3:
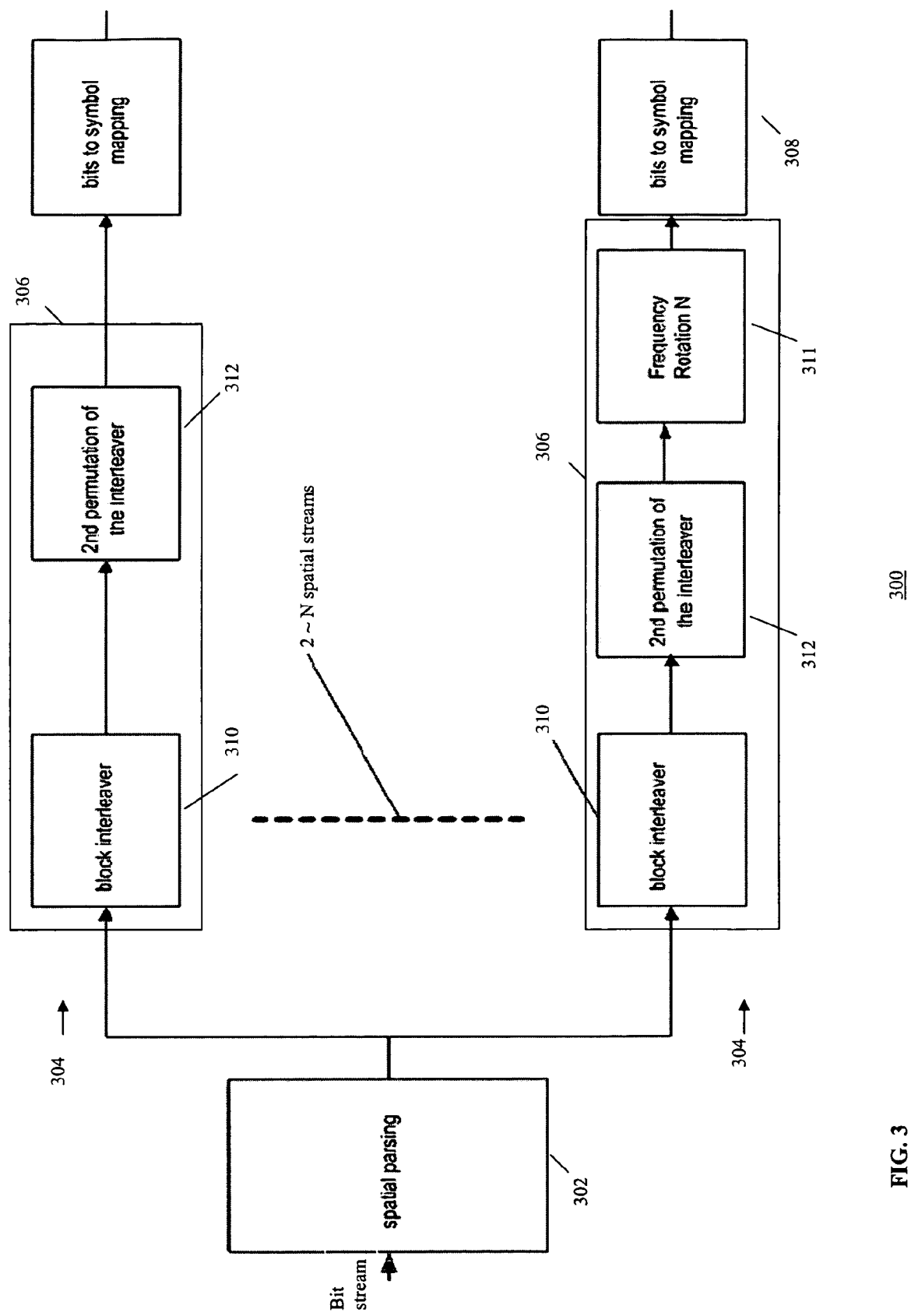
FIG. 3 shows a functional block diagram of example interleavers according to another embodiment of the present invention.

FIG. 3 shows a more detailed block diagram of a transmitter 300 utilizing an interleaving process for multiple spatial stream paths, according to another embodiment of the present invention. The transmitter 300 includes a spatial parser 302, and multiple (i.e., 2 to n, e.g. n=4) spatial stream processing paths 304. Each path 304 includes an interleaver 306 and a bit to symbol mapper 308. Each interleaver comprises a block first permutation interleaver 310 and a second permutation interleaver 312. Then, for different spatial streams beyond the first spatial stream processing path, an N-frequency rotation is performed by the frequency rotation block 311.

After spatial parsing of the input bit stream into multiple spatial streams by the parser 302, each spatial stream is processed in a corresponding spatial stream processing path 304. Then, the bits processed in each spatial stream path 304 are transmitted via a channel (e.g., as in system 100 of FIG. 1A).

As noted, in the example of FIG. 3, the interleaver 306 in each spatial stream path beyond the first spatial stream processing path comprises a block first permutation interleaver 310, a second permutation interleaver 312 and a third permutation of frequency rotation 311, wherein the frequency rotation interleavers 311 are configured according to the present invention (e.g., relations 12 through 14 above).

Figure 4:
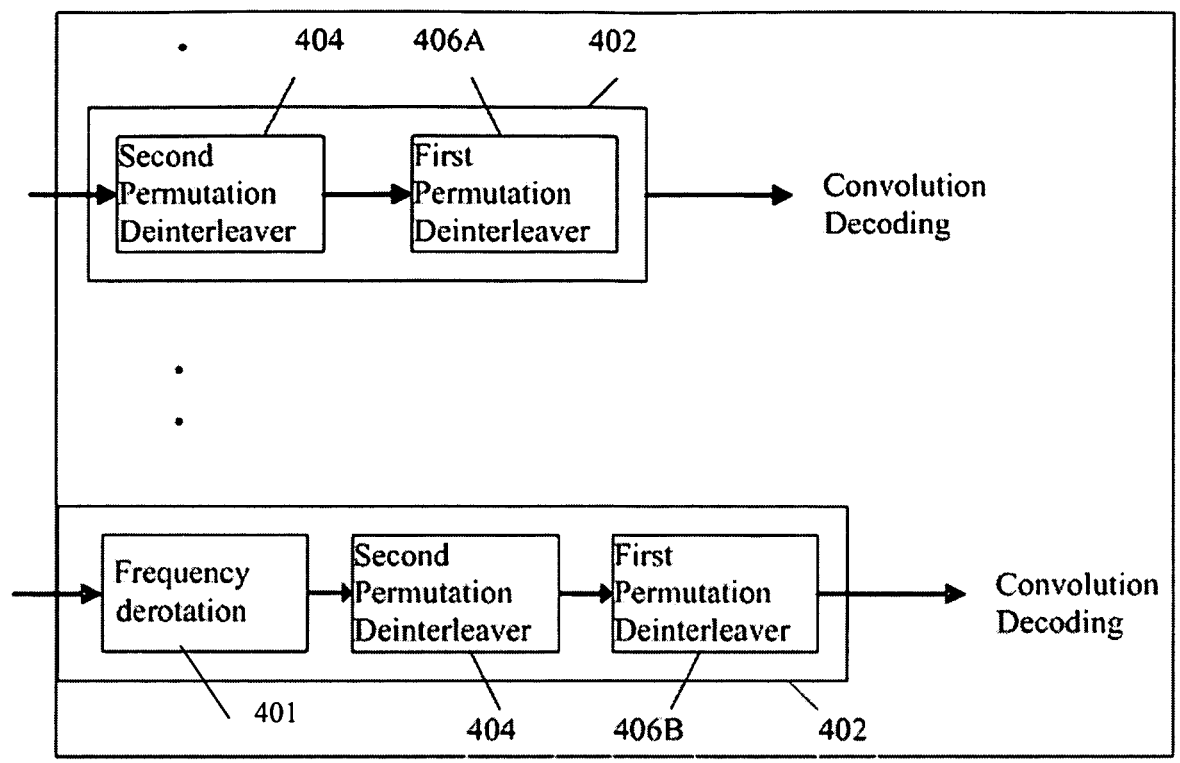
FIG. 4 shows a functional block diagram of an embodiment of an OFDM MIMO receiver including deinterleavers according to the present invention.

Referring to FIG. 4, an example receiver 400 performs the reverse operation, wherein the receiver 400 includes a de-interleaver 402 for each spatial stream for de-interleaving the received bits of each spatial stream according to the present invention. Each deinterleaver 402 beyond the first path comprises a third permutation frequency de-rotation 401, a second permutation deinterleaver 404 implementing relation (5) above and first permutation deinterleaver 406A, 406B (e.g., implementing relations 15 through 17 above).

Example simulations have verified the performance gains of the further improved interleaving process according to the present invention in 20 MHz MIMO channelizations. The coding and modulation modes for the example simulations are listed in Table 3.

TABLE 3

Modulation and Coding Scheme (MCS) definition in simulation

| Number of spatial streams | Modulation | Coding rate |
|---|---|---|
| 2 | 64-QAM | 5/6 |
| 2 | 64-QAM | 7/8 |

Figure 5A:
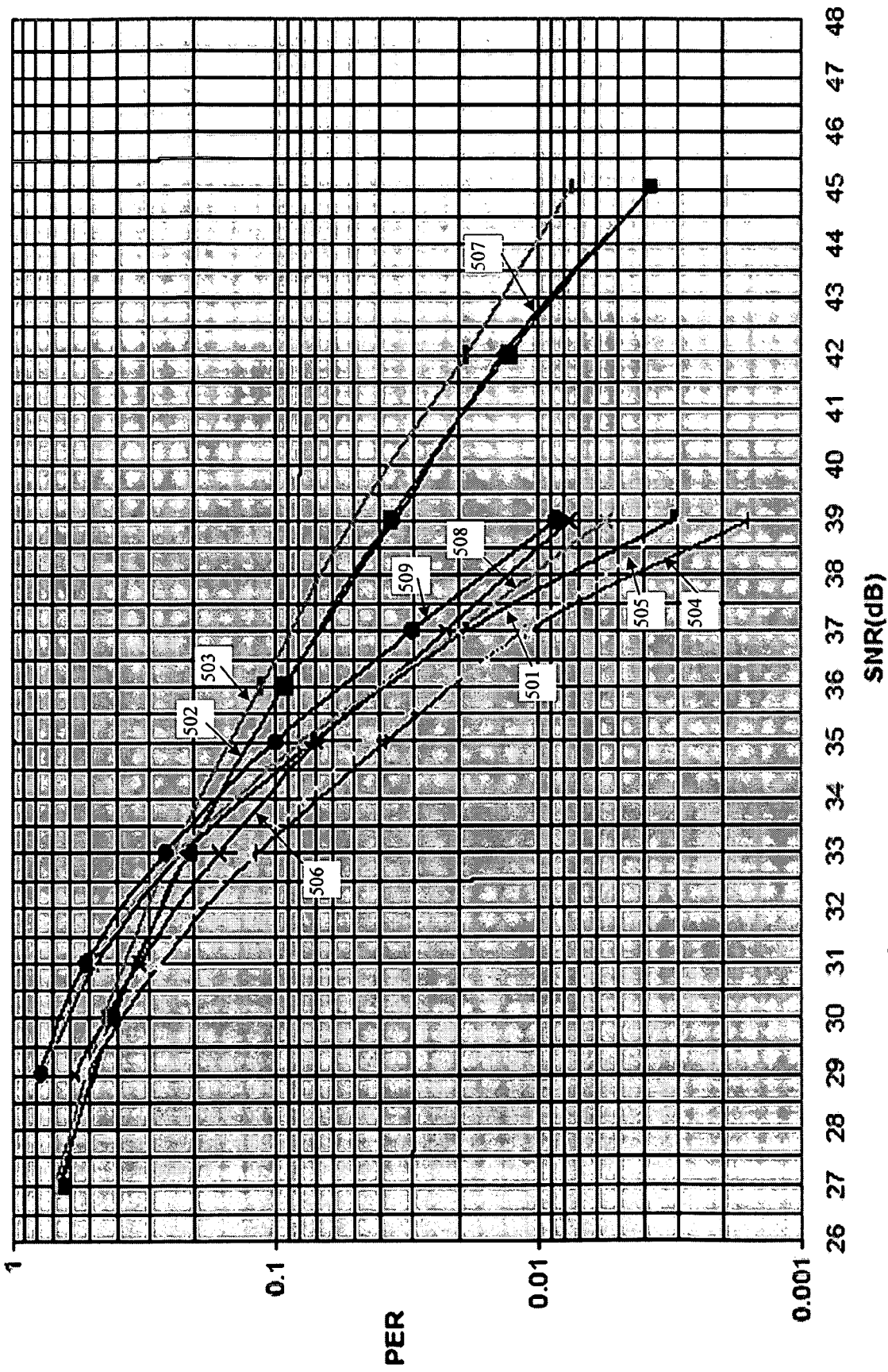
FIGS. 5A-B show example simulation results in 20 MHz channels.
Figure 5B:
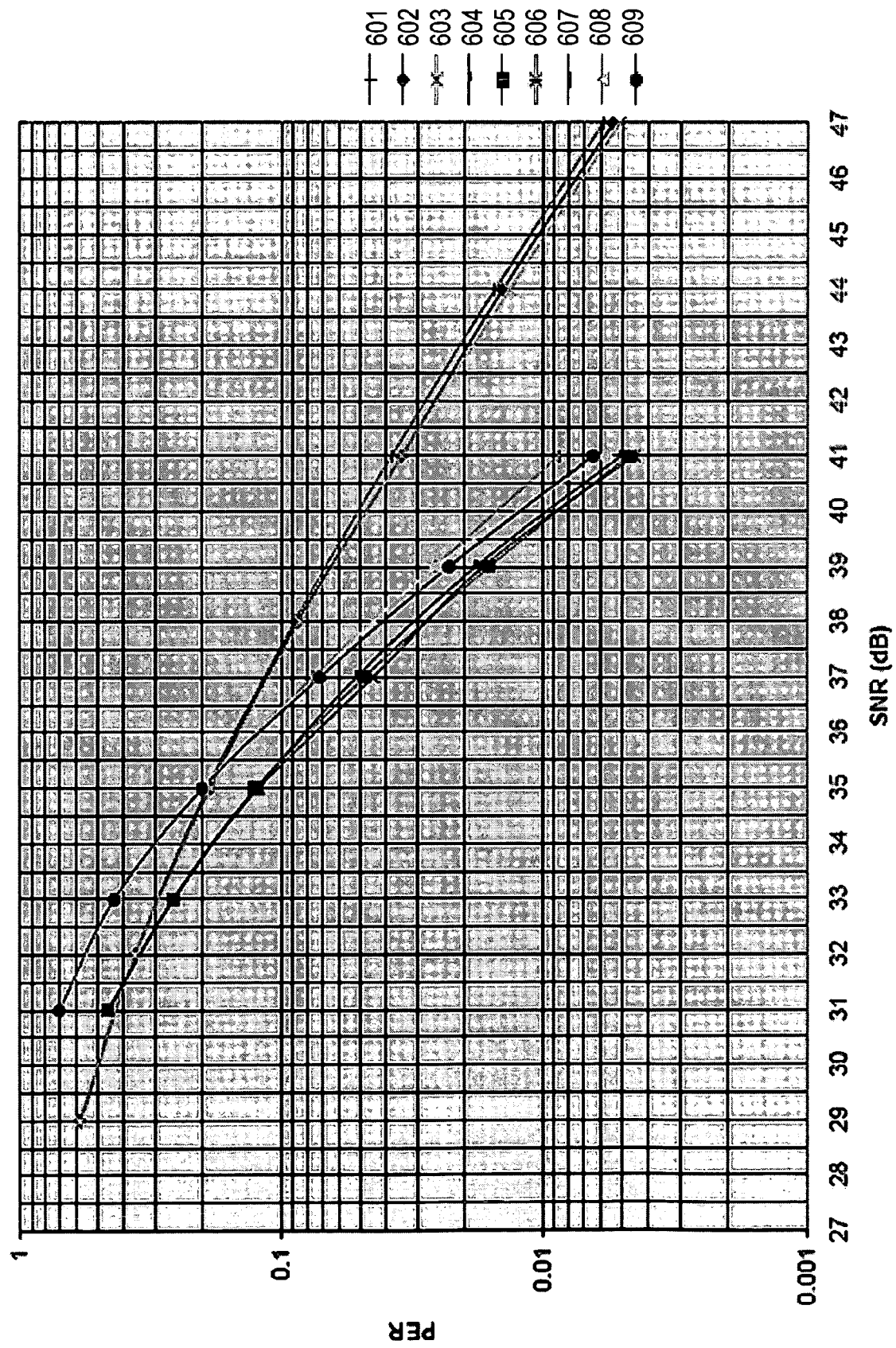

FIGS. 5A-B show example simulation comparative results for IEEE 802.11n channel models BLOS, DLOS, ELOS and DNLOS for above listed modulation and coding combination. For sake of simplicity of example, perfect synchronization, no RF impairment, and perfect channel estimation is assumed. Further, an MMSE detector is utilized for data stream separation.

In the example shown in FIG. 5A, graphs 501, 502 and 503 represent CC5/6 BNLOS performance according to said commonly assigned patent application Ser. No. 11/292,851, CC5/6 BNLOS performance according to the present invention, and CC5/6 BNLOS performance according the prior art, respectively.

Similarly, graphs 504, 505 and 506 represent CC5/6 DNLOS performance according to said commonly assigned patent application Ser. No. 11/292,851, CC5/6 DNLOS performance according to the present invention, and CC5/6 DNLOS performance according the prior art, respectively.

Similarly, graphs 504, 505 and 506 represent CC5/6 ENLOS performance according to said commonly assigned patent application Ser. No. 11/292,851, CC5/6 ENLOS performance according to the present invention, and CC5/6 ENLOS performance according the prior art, respectively.

In the example shown in FIG. 5B, graphs 601, 602 and 603 represent CC7/8 BNLOS performance according to said commonly assigned patent application Ser. No. 11/292,851, CC7/8 BNLOS performance according to the present invention, and CC7/8 BNLOS performance according the prior art, respectively.

Similarly, graphs 604, 605 and 606 represent CC7/8 DNLOS performance according to said commonly assigned patent application Ser. No. 11/292,851, CC7/8 DNLOS performance according to the present invention, and CC7/8 DNLOS performance according the prior art, respectively.

Similarly, graphs 607, 608 and 609 represent CC7/8 ENLOS performance according to said commonly assigned patent application Ser. No. 11/292,851, CC7/8 ENLOS performance according to the present invention, and CC7/8 ENLOS performance according the prior art, respectively.

Various simulation results show that the simplified method has the similar performance as the scheme in commonly assigned patent application Ser. No. 11/292,851. The main performance improvement factors are the frequency rotation among spatial data streams.

Figure 6:
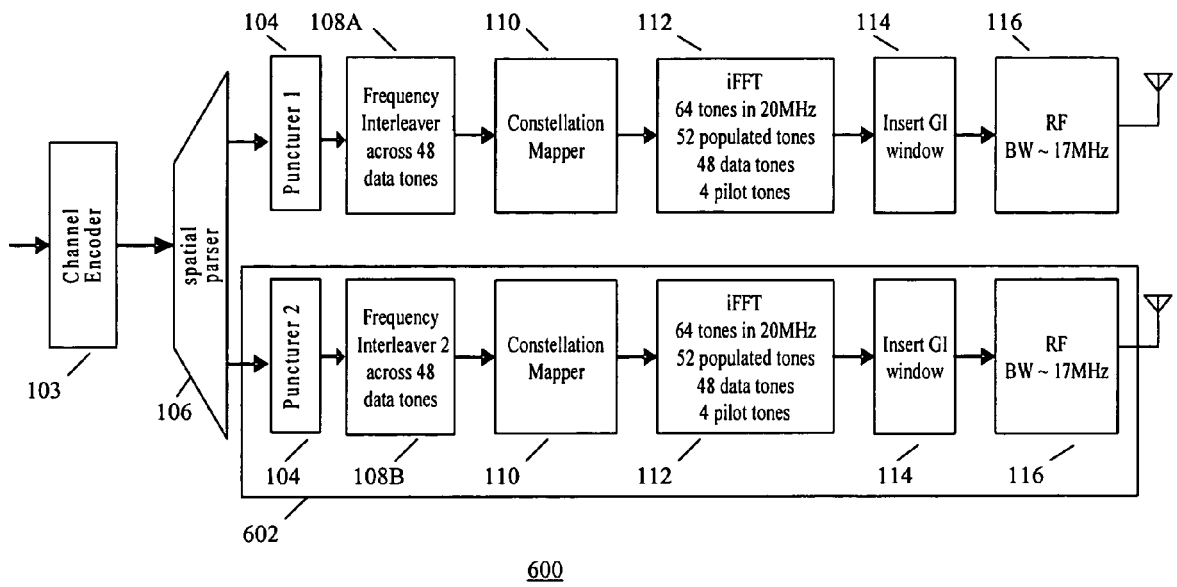
FIG. 6 shows a functional block diagram of an embodiment of an OFDM MIMO transmitter according to another embodiment of the present invention.

An improved interleaving process according to the present invention can be implemented in a modified OFDM MIMO transmitter architecture 600 for a 20 MHz channel is shown in FIG. 6, according to another embodiment of the present invention. Compared to FIG. 1A, in the modified transmitter architecture of FIG. 6, the puncturing processing is performed after the parsing processing. In this case, two puncturers are utilized, one puncturer per data stream processing path. With this modified structure, a MIMO system can transmit data streams with different coding rates simultaneously.

The transmitter 600 includes a channel encoder 103, a spatial parser 106, and two data stream processing paths 602. Each data stream processing path 602 includes a puncturer 104, an interleaver (e.g., interleavers 108A and 108B), a constellation mapper 110, an IFFT function 112, and guard-interval insertion window 114 and an RF modulator 116. For the parser 106 and the interleaver 108A/108B portions of the transmitter, coded and punctured bits are interleaved across spatial streams and frequency tones.

As shown, in the transmitter 600, each spatial data stream path includes a puncturer 104, allowing different transmission rates for the two spatial streams (based on the channel conditions). In one example, one puncturer 104 provides a convolutional code 1/2 for a first data stream, and the other puncture 104 provides a convolution code 3/4 for the second data stream. Using multiple puncturers 104 provides more flexibility. For example, where there are two transmitter antennas, if the first antenna provides a better channel than the second antenna, then on the first antenna a high transmission data rate can be achieved, and on the second antenna somewhat lower data transmission rate is achieved. This combination makes a MIMO OFDM system according to the present invention more flexible and essentially allows optimization of the transmission.

As those skilled in the art will recognize, the example transmitter in FIG. 1B can be similarly modified such that the puncturing processing is performed after the parsing processing, wherein two puncturers are utilized (one puncturer per data stream processing path), much the same way as shown in FIG. 6 and described above.

As those skilled in the art will recognize, other implementations of the present invention are possible, and the present invention is not limited to the example number of frequency rotations described above. The selected set of parameters is chosen based on the specific number of subcarriers in the 802.11n system. In other systems with different number of subcarriers and parsers, the principles of the present invention can be used while the specific rotation parameters can be different.

The present invention has been described in considerable detail with reference to certain preferred versions thereof; however, other versions are possible. Therefore, the spirit and scope of the appended claims should not be limited to the description of the preferred versions contained herein.

What is claimed is:

1. A method of data communication in a wireless system, comprising the steps of:

parsing a bit stream into multiple spatial data streams;

interleaving the bits in each of one or more spatial data streams by performing frequency rotation after an interleaving operation, to increase diversity of the wireless system, wherein frequency rotation is performed according to relation:

$$r=(j-((2 \times i_{ss}) \bmod 3 + 3 \times \text{floor}(i_{ss}/3)) \times N_{rot} \times N_{BPSC}) \bmod N_{CBPS}, j=0, 1, \ldots, N_{CBPS}-1,$$

wherein $N_{BPSC}$ is the number of coded bits per subcarrier, $N_{CBPS}$ is a block size corresponding to a number of coded bits in a single Orthogonal Frequency Division Multiplexing (OFDM) symbol, j is an index after a second permutation and before a third permutation, r is an index after the third permutation, $i_{SS}=0, 1, \ldots, N_{SS}-1$ is the index of the spatial stream on which interleaving is operating, $N_{ss}$ is the number of spatial streams, and $N_{rot}$ is a base rotation number in use and transmitting the bits of each spatial data stream.

2. The method of claim 1 wherein the number of frequency rotations for a spatial data stream is a function of the number of the total spatial data streams.

3. The method of claim 1 wherein the steps of interleaving the bits in a spatial data stream includes the steps of performing a first interleaving permutation to ensure that adjacent coded bits are mapped onto nonadjacent subcarriers in one data stream for transmission, and a second permutation to ensure that coded bits are mapped alternately onto less and more significant bits of the constellation, and a third interleaving permutation providing the frequency rotation, varying on different spatial data streams to increase diversity of the wireless system.

4. The method of claim 1, wherein the steps of interleaving the bits in a spatial data stream includes the steps of: (a) ensuring that adjacent coded bits are mapped onto nonadjacent sub-carriers, and (b) ensuring that coded bits are mapped alternately onto less and more significant bits of the constellation whereby long runs of low reliability (LSB) bits are avoided.

5. The method of claim 4 wherein each spatial data stream interleaver array includes $N_{row}$ rows and $N_{column}$ columns of bits, wherein:

the steps (a) of ensuring that adjacent coded bits are mapped onto nonadjacent sub-carriers is according to relation:

$$i = N_{row} \times (k \bmod N_{column}) + \text{floor}(k/N_{column}), k=0, 1, \ldots, N_{CBPS}-1,$$

the steps (b) of ensuring that coded bits are mapped alternately onto less and more significant bits of the constellation whereby long runs of low reliability (LSB) bits are avoided is according to relation:

$$j = s \times \text{floor}(i/s) + (i + N_{CBPS} - \text{floor}(N_{column} \times i/N_{CBPS})) \bmod s, \; i=0, 1, \ldots, N_{CBPS}-1,$$

where s is determined according to $s = \max(N_{BPSC}/2, 1)$, and k denotes the index of the coded bit before a first permutation.

6. The method of claim 4 further including the steps of receiving the transmitted bits of each spatial bit stream, and deinterleaving the received bits according to relations:

$$x_d = (x_{dd} + ((2 \times i_{ss}) \bmod 3 + 3 \times \text{floor}(i_{ss}/3)) \times N_{rot} \times N_{BPSC}) \bmod N_{CBPS}, \; x_{dd} = 0, 1, \ldots, N_{CBPS}-1$$

$$j_d = s \times \text{floor}(j_{dd}/s) + (j + \text{floor}(N_{column} \times j_{dd}/N_{CBPS})) \bmod s$$
$$j_{dd} = 0, 1, \ldots, N_{CBPS}-1,$$

$$i_d = N_{column} \times i_{dd} - (N_{CBPS}-1) \times \text{floor}(N_{column} \times i_{dd}/N_{CBPS}),$$
$$i_{dd} = 0, 1, \ldots, N_{CBPS}-1,$$

wherein the index of the coded bit before the first permutation is denoted by $x_{dd}$, and $x_d$ is the index after the first and before the second permutation, and $j_d$ is the index after the second permutation and before the third permutation, $i_d$ is the index after the third permutation, and $N_{CBPS}$ denotes a block size corresponding to the number of coded bits in a single OFDM symbol, $i_{SS}=0, 1, \ldots, N_{SS}-1$ is the index of the spatial stream on which this interleaving is operating, and $N_{rot}$ is a base rotation number in use.

7. The method of claim 1 wherein the wireless system comprises a multiple-input multiple-output (MIMO) system.

8. The method of claim 7 wherein the wireless system comprises an OFDM MIMO system.

9. The method of claim 1 wherein the steps of parsing the bit stream further includes the steps of bitwise or group-wise round robin parsing to increase spatial diversity.

10. The method of claim 9 wherein the steps of parsing the bit stream further includes the steps of bitwise round robin parsing such that one bit of the bit stream is parsed to one data stream each time.

11. The method of claim 1 further including the steps of puncturing each spatial data stream after the step of parsing.

12. The method of claim 11 wherein the step of puncturing for each spatial data stream is based on the channel condition.

13. A wireless communication system, comprising:
a transmitter including:
  a parser that parses a bit stream into multiple spatial data streams;
  multiple interleavers corresponding to the multiple spatial data streams, wherein each of one or more interleavers interleaves the bits in the corresponding spatial data stream by performing frequency rotation after an interleaving operation, to increase diversity of the wireless system, wherein frequency rotation is performed according to relation:

$$r = (j - ((2 \times i_{ss}) \bmod 3 + 3 \times \text{floor}(i_{ss}/3)) \times N_{rot} \times N_{BPSC}) \bmod N_{CBPS}, \; j=0, 1, \ldots, N_{CBPS}-1,$$

wherein
$N_{BPSC}$ is the number of coded bits per subcarrier,
$N_{CBPS}$ is a block size corresponding to a number of coded bits in a single Orthogonal Frequency Division Multiplexing (OFDM) symbol,
j is an index after a second permutation and before a third permutation,
r is an index after the third permutation, $i_{SS}=0, 1, \ldots, N_{SS}-1$ is the index of the spatial stream on which interleaving is operating, $N_{ss}$ is the number of spatial streams, and
$N_{rot}$ is a base rotation number in use; and
a modulator that transmits the bits of each spatial data stream; and
a receiver that receives and deinterleaves the transmitted bits.

14. The system claim 13 wherein an interleaver performs a first interleaving permutation to ensure that adjacent coded bits are mapped onto nonadjacent subcarriers in one data stream for transmission, and a second permutation to ensure that coded bits are mapped alternately onto less and more significant bits of the constellation, and a third interleaving permutation varying on different spatial data streams by performing different frequency rotation to increase diversity of the wireless system.

15. The system of claim 14, wherein the interleaver performs interleaving the bits in each spatial data stream by: (a) ensuring that adjacent coded bits are mapped onto nonadjacent sub-carriers, and (b) ensuring that coded bits are mapped alternately onto less and more significant bits of the constellation whereby long runs of low reliability (LSB) bits are avoided.

16. The system of claim 15 wherein each spatial data stream interleaver array includes $N_{row}$ rows and $N_{column}$ columns of bits, wherein:
ensuring that adjacent coded bits are mapped onto nonadjacent sub-carriers is according to relation:

$$i = N_{row} \times (k \bmod N_{column}) + \text{floor}(k/N_{column}), \; k=0, 1, \ldots, N_{CBPS}-1,$$

ensuring that coded bits are mapped alternately onto less and more significant bits of the constellation whereby long runs of low reliability (LSB) bits are avoided is according to relation:

$$j = s \times \text{floor}(i/s) + (i + N_{CBPS} - \text{floor}(N_{column} \times i/N_{CBPS})) \bmod s, \; i=0, 1, \ldots, N_{CBPS}-1,$$

where s is determined according to $s = \max(N_{BPSC}/2, 1)$, and k denotes the index of the coded bit before a first permutation.

17. The system of claim 16 wherein the receiver includes a plurality of deinterleavers such that each deinterleaver deinterleaves the bits in a received spatial data stream.

18. The system of claim 17 wherein each deinterleaver deinterleaves the received bits according to relations:

$$x_d = (x_{dd} + ((2 \times i_{ss}) \bmod 3 + 3 \times \text{floor}(i_{ss}/3)) \times N_{rot} \times N_{BPSC}) \bmod N_{CBPS}, \; x_{dd} = 0, 1, \ldots, N_{CBPS}-1$$

$$j_d = s \times \text{floor}(j_{dd}/s) + (j + \text{floor}(N_{column} \times j_{dd}/N_{CBPS})) \bmod s$$
$$j_{dd} = 0, 1, \ldots, N_{CBPS}-1,$$

$$i_d = N_{column} \times i_{dd} - (N_{CBPS}-1) \times \text{floor}(N_{column} \times i_{dd}/N_{CBPS}),$$
$$i_{dd} = 0, 1, \ldots, N_{CBPS}-1,$$

wherein the index of the coded bit before the first permutation is denoted by $x_{dd}$, and $x_d$ is the index after the first and before the second permutation, $j_d$ is the index after the second permutation and before the third permutation, $i_d$ is the index after the third permutation, $N_{CBPS}$ denotes a block size corresponding to the number of coded bits in a single OFDM symbol, $i_{SS}=0, 1, \ldots, N_{SS}-1$ is the index of the spatial stream on which this interleaver is operating, and $N_{rot}$ is a base rotation number in use.

19. The system of claim 13 wherein the wireless system comprises a MIMO system.

20. The system of claim 19 wherein the wireless system comprises an OFDM MIMO system.

21. The system of claim 13 wherein the parser parses the bit stream by bitwise round robin parsing, to increase spatial diversity.

22. The system of claim 21 wherein the parser parses the bit stream by bitwise round robin parsing such that one bit of the bit stream is parsed to one data stream each time.

23. A wireless apparatus, comprising:
  a transmitter including:
    a parser that parses a bit stream into multiple spatial data streams;
    multiple interleavers corresponding to the multiple spatial data streams, wherein each of one or more interleavers interleaves the bits in the corresponding spatial data stream by performing frequency rotation after an interleaving operation, to increase diversity of the wireless system, wherein frequency rotation is performed according to relation:

$$r = (j - ((2 \times i_{ss}) \bmod 3 + 3 \times \mathrm{floor}(i_{ss}/3)) \times N_{rot} \times N_{BPSC}) \bmod N_{CBPS}, \quad j=0, 1, \ldots, N_{CBPS}-1,$$

wherein $N_{BPSC}$ is the number of coded bits per subcarrier, $N_{CBPS}$ is a block size corresponding to a number of coded bits in a single Orthogonal Frequency Division Multiplexing (OFDM) symbol, j is an index after a second permutation and before a third permutation, r is an index after the third permutation, $i_{SS}=0, 1, \ldots, N_{SS}-1$ is the index of the spatial stream on which interleaving is operating, $N_{ss}$ is the number of spatial streams, and $N_{rot}$ is a base rotation number in use; and a modulator that transmits the bits of each spatial data stream.

* * * * *

UNITED STATES PATENT AND TRADEMARK OFFICE
CERTIFICATE OF CORRECTION

PATENT NO. : 7,859,987 B2
APPLICATION NO. : 11/313403
DATED : December 28, 2010
INVENTOR(S) : Xuemei Ouyang et al.

It is certified that error appears in the above-identified patent and that said Letters Patent is hereby corrected as shown below:

In the claims

Column 12, lines 21-22, Delete

"$r=(j-((2\times i_{ss})\bmod 3+3\times floor(i_{ss}/3))\times N_{rot}\times N_{BPSC})\bmod$
$N_{CBPS}, j=0, 1, \ldots, N_{CBPS}-1,$ and insert --$r=(j-((2\times(i_{ss}-1))\bmod 3+3\times floor((i_{ss}-1)/3))\times N_{rot} \times N_{BPSC})\bmod$
$N_{CBPS}, j=0, 1, \ldots, N_{CBPS}-1,$--

Column 12, line 32, Delete "$i_{ss}=0, 1, \ldots, N_{ss}-1$" and insert --$i_{ss}=1, \ldots, N_{ss}$--

Column 13, lines 12-13, Delete

"$x_d=(x_{dd}+((2\times i_{ss})\bmod 3+3\times floor(i_{ss}/3))\times N_{rot}\times N_{BPSC})$"
$\bmod N_{CBPS}, x_{dd}=0, 1, \ldots, N_{CBPS}-1$ and insert --$x_d=(x_{dd}+((2\times(i_{ss}-1))\bmod 3+3\times floor((i_{ss}-1)/3))\times N_{rot} \times N_{BPSC})$
$\bmod N_{CBPS}, x_{dd}=0, 1, \ldots, N_{CBPS}-1$--

Column 13, lines 26-27, Delete "$i_{ss}=0, 1, \ldots, N_{ss}-1$" and insert --$i_{ss}=1, \ldots, N_{ss}$--

Column 13, lines 57-58, Delete

"$r=(j-((2\times i_{ss})\bmod 3+3\times floor(i_{ss}/3))\times N_{rot}\times N_{BPSC})\bmod$"
$N_{CBPS}, j=0, 1, \ldots, N_{CBPS}-1,$ and insert --$r=(j-((2\times(i_{ss}-1))\bmod 3+3\times floor((i_{ss}-1)/3))\times N_{rot} \times N_{BPSC})\bmod$
$N_{CBPS}, j=0, 1, \ldots, N_{CBPS}-1,$--

Signed and Sealed this
Twenty-second Day of October, 2013

Teresa Stanek Rea
*Deputy Director of the United States Patent and Trademark Office*

Column 14, line 1, Delete "$i_{ss}=0, 1, \ldots, N_{ss}-1$" and insert --$i_{ss}=1, \ldots, N_{ss}$--

Column 14, lines 48-49, Delete
"$x_d=(x_{dd}+((2 \times i_{ss}) \bmod 3+3 \times floor(i_{ss}/3)) \times N_{rot} \times N_{BPSC})$
mod $N_{CBPS}$, $x_{dd}=0, 1, \ldots, N_{CBPS}-1$"

and insert --$x_d=(x_{dd}+((2 \times (i_{ss}-1)) \bmod 3+3 \times floor((i_{ss}-1)/3)) \times N_{rot} \times N_{BPSC})$
mod $N_{CBPS}$, $x_{dd}=0, 1, \ldots, N_{CBPS}-1$--

Column 14, lines 62-63, Delete "$i_{ss}=0, 1, \ldots, N_{ss}-1$" and insert --$i_{ss}=1, \ldots, N_{ss}$--

Column 16, lines 1-2, Delete
"$r=(j-((2 \times i_{ss}) \bmod 3+3 \times floor(i_{ss}/3)) \times N_{rot} \times N_{BPSC}) \bmod$
$N_{CBPS}$, $j=0, 1, \ldots, N_{CBPS}-1$, and insert --$r=(j-((2 \times (i_{ss}-1)) \bmod 3+3 \times floor((i_{ss}-1)/3)) \times N_{rot} \times N_{BPSC}) \bmod$
$N_{CBPS}$, $j=0, 1, \ldots, N_{CBPS}-1$,--

Column 16, line 11, Delete "$i_{ss}=0, 1, \ldots, N_{ss}-1$" and insert --$i_{ss}=1, \ldots, N_{ss}$--